United States Patent
Choi et al.

(10) Patent No.: US 8,043,914 B2
(45) Date of Patent: Oct. 25, 2011

(54) METHODS OF FABRICATING FLASH MEMORY DEVICES COMPRISING FORMING A SILICIDE ON EXPOSED UPPER AND SIDE SURFACES OF A CONTROL GATE

(75) Inventors: Jong-wan Choi, Gyconggi-do (KR);
Yong-soon Choi, Gyeonggi-do (KR);
Bo-young Lee, Gyeonggi-do (KR);
Eunkee Hong, Gyeonggi-do (KR);
Eun-kyung Baek, Gyeonggi-do (KR);
Ju-seon Goo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 48 days.

(21) Appl. No.: 12/629,920

(22) Filed: Dec. 3, 2009

(65) Prior Publication Data

US 2010/0167490 A1 Jul. 1, 2010

(30) Foreign Application Priority Data

Dec. 31, 2008 (KR) .................. 10-2008-0138567

(51) Int. Cl.
*H01L 21/336* (2006.01)
(52) U.S. Cl. . 438/266; 438/587; 257/316; 257/E21.129; 257/E21.422
(58) Field of Classification Search .......... None
See application file for complete search history.

(56) References Cited

U.S. PATENT DOCUMENTS

| | | | |
|---|---|---|---|
| 2004/0121590 A1* | 6/2004 | Moon et al. | 438/639 |
| 2004/0157453 A1* | 8/2004 | Delgadino et al. | 438/691 |
| 2006/0289938 A1* | 12/2006 | Kim | 257/365 |
| 2007/0034929 A1* | 2/2007 | Hwang et al. | 257/314 |
| 2007/0057316 A1* | 3/2007 | Yaegashi | 257/321 |
| 2008/0003745 A1* | 1/2008 | Myung et al. | 438/257 |
| 2008/0057736 A1* | 3/2008 | Lee | 438/763 |
| 2010/0210099 A1* | 8/2010 | Hur et al. | 438/586 |

FOREIGN PATENT DOCUMENTS

| | | |
|---|---|---|
| JP | 2007-073887 | 3/2007 |
| KR | 1020080003171 A | 1/2008 |
| KR | 1020080006897 A | 1/2008 |

* cited by examiner

*Primary Examiner* — Thanh V Pham
*Assistant Examiner* — Andres Munoz
(74) *Attorney, Agent, or Firm* — Myers Bigel Sibley & Sajovec (57) ABSTRACT

Provided are methods of fabricating flash memory devices that may prevent a short circuit from occurring between cell gate lines. Methods of fabricating such flash memory devices may include forming gate lines including a series of multiple cell gate lines and multiple selection gate lines. Each gate line may include a stacked structure of a tunnel insulating layer, a floating gate, a gate insulating layer, and/or a polysilicon layer operable to be a control gate, all formed on a semiconductor substrate. Methods may include forming a first insulating layer that selectively fills gaps between the cell gate lines from the bottom up and between adjacent ones of the cell gate lines and the selection gate lines, and does not fill a space located on outer sides of the selection gate lines that are opposite the plurality of cell gate lines. A spacer may be formed on the outer sides of the selection gate lines that are opposite to the cell gate lines, after forming the first insulating layer. A second insulating layer may be formed in a space where the spacer is formed.

15 Claims, 6 Drawing Sheets

METHODS OF FABRICATING FLASH MEMORY DEVICES COMPRISING FORMING A SILICIDE ON EXPOSED UPPER AND SIDE SURFACES OF A CONTROL GATE

CROSS-REFERENCE TO RELATED APPLICATIONS

This application claims the benefit of Korean Patent Application No. 10-2008-0138567, filed on Dec. 31, 2008, in the Korean Intellectual Property Office, the disclosure of which is incorporated herein in its entirety by reference as if set forth fully herein.

BACKGROUND

The present invention relates to methods of fabricating semiconductor devices, and more particularly, to methods of fabricating memory devices.

Flash memory devices, that is, non-volatile memory devices, may be classified into NAND flash memory devices that may be suitable for storing data blocks and NOR flash memory devices that may be suitable for storing code data.

In a NAND flash memory device, 8, 16, 32, or 64 cells, for example, may form a long string. Since bit lines may not require contact holes formed in the cells of the string, a high packing density may be realized.

Figure 1A:
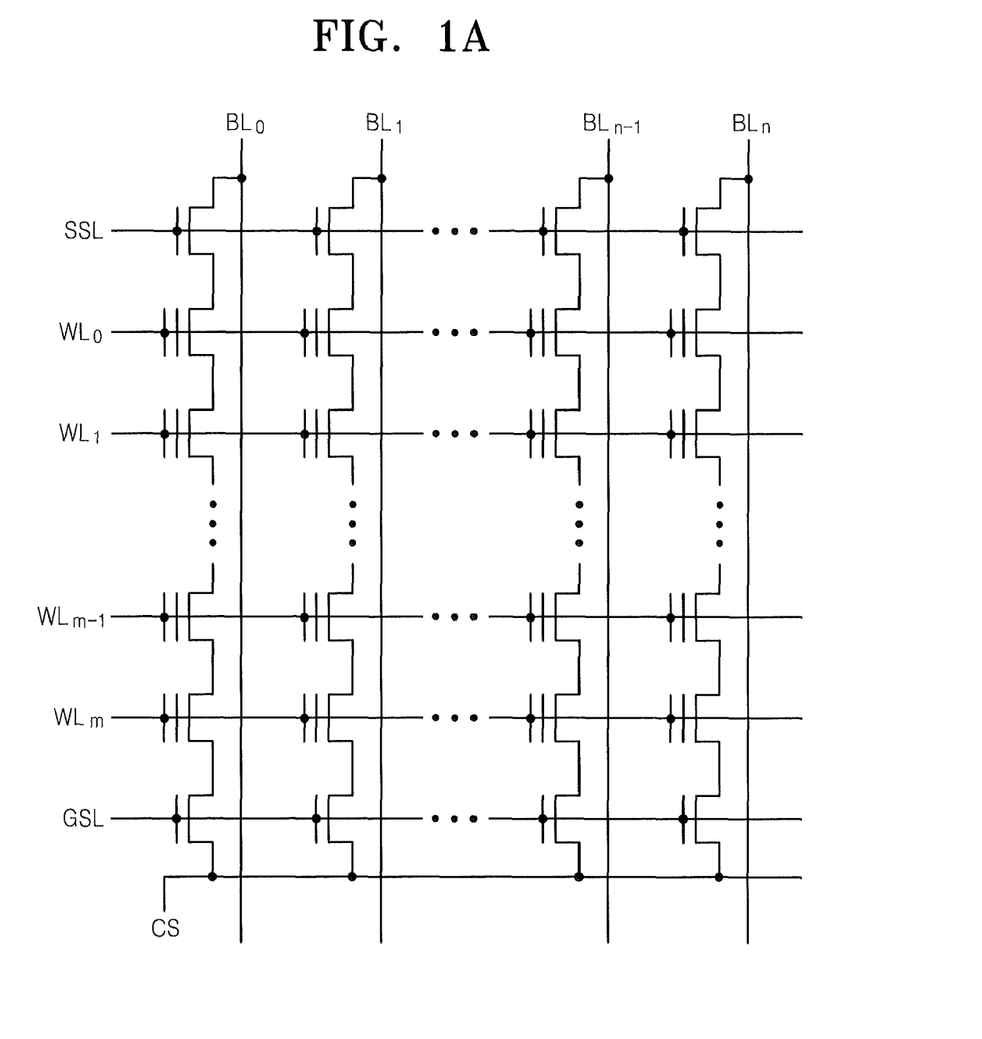
FIG. 1A is a diagram of a cell array of a conventional NAND flash memory device.
Figure 1B:
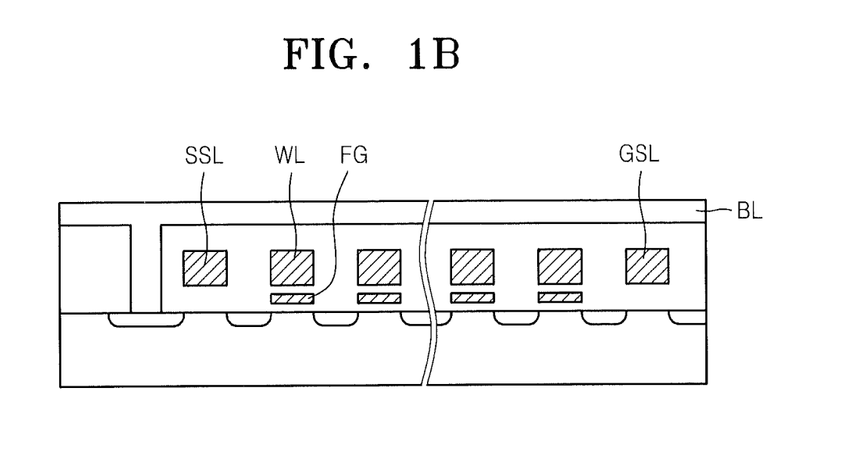
FIG. 1B is a cross-sectional view of a cell string included in the cell array of the conventional NAND flash memory device shown in FIG. 1A.

FIG. 1A is a diagram of a cell array in a conventional NAND flash memory device and FIG. 1B is a cross-sectional view of a cell string included in the cell array of the conventional NAND flash memory device illustrated in FIG. 1A. Referring to FIGS. 1A and 1B, cells including gate lines and bit lines that cross each other at a substantially right angle are connected to each other in series to form the cell strings. A source selection line (SSL) and a ground selection line (GSL) are formed at both ends of a cell string. A gate line includes a control gate and a floating gate, and the control gate is connected to other control gates to form a word line. The bit lines proceed in parallel with the cell strings.

In a NAND flash memory device, there may be no contact hole between cells, and accordingly, distances between word lines are narrow and cell-to-cell interference may be likely to occur. In order to reduce the interference between the cells, a low k dielectric layer may be used between cell gate lines.

In addition, when an insulating layer is formed between the cell gate lines with a deposition method, a seam or a void may be generated in the insulating layer due to the narrow distance between the cell gate lines. The seam or void may result in a bridge between the cells when a metal silicide of a control gate is formed.

SUMMARY

Some embodiments of the present invention include methods of fabricating flash memory devices. Such methods may include forming gate lines including a series of multiple cell gate lines and multiple selection gate lines. Each gate line may include a stacked structure of a tunnel insulating layer, a floating gate, a gate insulating layer, and/or a polysilicon layer operable to be a control gate, all formed on a semiconductor substrate. Methods may include forming a first insulating layer that selectively fills gaps between the cell gate lines from the bottom up and between adjacent ones of the cell gate lines and the selection gate lines, and does not fill a space located on outer sides of the selection gate lines that are opposite the plurality of cell gate lines. A spacer may be formed on the outer sides of the selection gate lines that are opposite to the cell gate lines, after forming the first insulating layer. A second insulating layer may be formed in a space where the spacer is formed.

Some embodiments provide that the method may further include forming a diffusion barrier on the gate lines, before forming the first insulating layer.

In some embodiments, the first insulating layer may be formed in a chemical vapor deposition (CVD) method using octamethylcyclotetrasiloxane (OMCTS) and/or tetramethylorthosilicate (TMOS) as a source material.

Some embodiments provide that the forming of the first insulating layer may be performed at a deposition temperature of about 0° C. to 100° C. and a deposition pressure of about 0.5 Torr to 100 Torr.

In some embodiments, the first insulating layer may include a Si—O—H bonding and/or a Si—N—H bonding.

The first insulating layer may have a dielectric constant of about 1 to 3.5.

The spacer may be formed of a moderate temperature oxide (MTO) silicon oxide layer or a tetraethyl orthosilicate (TEOS) silicon oxide layer.

The methods may further include forming an etch stop layer, after forming the spacer and before forming the second insulating layer.

In some embodiments, the second insulating layer may include a high-density plasma (HDP) oxide layer.

The methods may further include removing the hard mask layer of the gate lines and removing some parts of the first insulating layer, the second insulating layer, and the spacer so that at least a part of upper and side surfaces of the polysilicon layer for a control gate in the gate lines is exposed. A metal silicide may be formed on the exposed portion of the polysilicon layer for the control gate and a third insulating layer may be formed on the semiconductor substrate on which the metal silicide is formed.

Some embodiments of the present invention include methods of fabricating a flash memory device. Such methods may include forming gate lines including a multiple cell gate lines and a selection gate line, each including a stacked structure of a tunnel insulating layer, a floating gate, a gate insulating layer, and/or a polysilicon layer operable to be a control gate, formed on a semiconductor substrate. A first insulating layer may be formed that selectively fills gaps between ones of the cell gate lines from the bottom up and gaps between a first side of the selection gate line and an adjacent one of the plurality of cell gate lines, and does not fill a space on a second side of the selection gate line that is opposite the first side of the selection gate line. A spacer may be formed on the second side of the selection gate line after forming the first insulating layer. A second insulating layer may be formed in a space where the spacer is formed.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

DETAILED DESCRIPTION OF THE EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 2A:
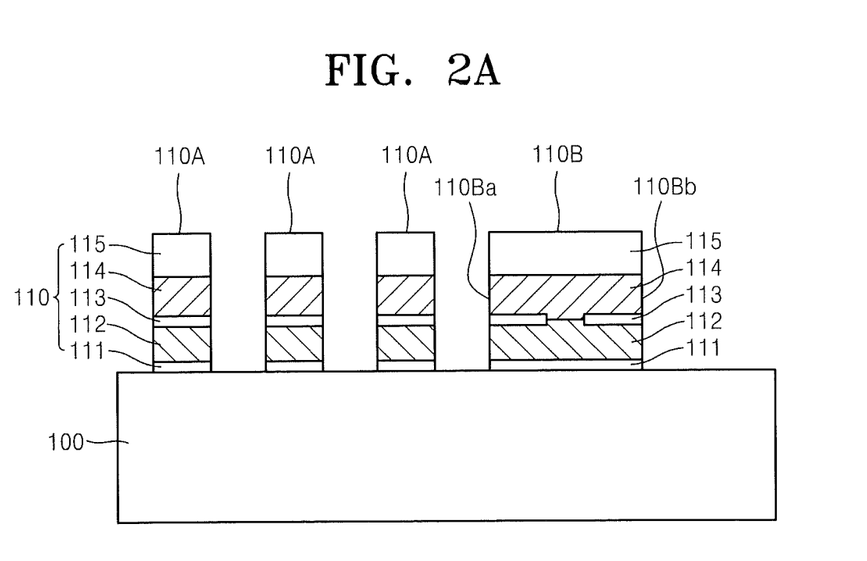
FIGS. 2A through 2I are cross-sectional views for describing operations for fabricating NAND flash memory devices according to some embodiments of the present inventive concept.

FIGS. 2A through 2I are cross-sectional views for describing operations for fabricating NAND flash memory devices according to some embodiments of the present invention. Referring to FIG. 2A, gate lines 110A and 110B may be formed. Each of the gate lines 110A and 110B may include a tunnel dielectric layer 111, a floating gate 112, a gate insulating layer 113, a polysilicon layer 114 for a control gate, and a hard mask layer 115 that are sequentially stacked on a semiconductor substrate 100.

Some embodiments provide that the tunnel insulating layer 111 may be formed of a silicon oxide layer by using a thermal oxidation method and/or a chemical vapour deposition (CVD) method, or may be formed of a high-k dielectric layer, such as, for example, $HfO_2$, $TiO_2$, $Ta_2O_5$, and/or $ZrO_2$, among others. The floating gate 112 may be formed of, for example, polysilicon, and may be divided by cells. The gate insulating layer 113 may be formed of, for example, a silicon oxide layer, and/or a stacked structure of the silicon oxide layer and a silicon nitride layer. The hard mask layer 115 may be formed of a silicon oxide layer, for example.

In some embodiments, a gate line 110A is a cell gate line storing electric charges, and a control gate of the gate line 110A forms a word line. The gate line 110B is a selection gate line that is a gate line of a selection transistor, and includes a source selection line (SSL) or a ground selection line (GSL). In the selection gate line 110B, an opening is formed in the gate insulating layer 113, and thus, the floating gate 112 and the polysilicon layer 114 for a control gate are short-circuited to form a general transistor.

Some embodiments provide that the selection gate line 110B is located on an outer portion of the cell gate lines 110A, which are repeated on the semiconductor substrate 100 with predetermined intervals. In this regard, among both sides 110Ba and 110Bb the selection gate line 110B, the side 110Bb that does not face the cell gate lines 110A may be exposed to a space that is much wider than the interval between the cell gate lines 110A.

A diffusion barrier (not shown) may be formed on the cell and selection gate lines 110A and 110B. The diffusion barrier may be formed of a moderate temperature oxide (MTO) silicon oxide layer and/or an atomic layer deposition (ALD) silicon oxide layer, among others. The diffusion barrier may prevent impurities that may be doped on the polysilicon layer 114 of the control gate or the polysilicon of the floating gate 112, from escaping. After forming the cell and selection gate lines 110A and 110B, ion implantation for forming a source/drain may be performed.

Figure 2B:
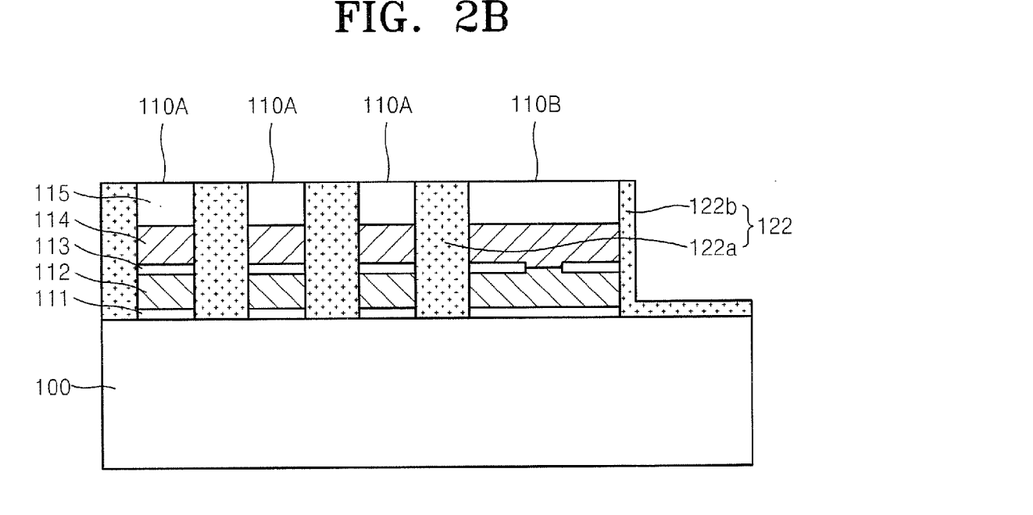

Referring to FIG. 2B, an insulating layer 122 is formed on the semiconductor substrate 100, on which the cell and selection gate lines 110A and 110B are formed. In some embodiments, the insulating layer 122 may be formed as a flowable oxide layer. The flowable oxide layer may be formed of a silizane-based material having a Si—N—H combination and/or a silanol-based material having a Si—O—H combination, among others. The flowable oxide layer may have a low dielectric constant of about 1 to about 3.5.

The insulating layer 122 formed of the flowable oxide layer may be formed using the CVD method. Octamethylcyclotetrasiloxane (OMCTS), tetramethylorthosilicate (TMOS), and/or mixtures thereof may be used as a precursor of the flowable oxide layer, and $O_2$, $O_3$, $H_2O$, and/or mixtures thereof may be used as a reaction gas. The precursor may chemically react with the reaction gas to form the flowable oxide layer. The flowable oxide layer may be formed at a deposition temperature of, for example, 100° C. or lower and at a deposition pressure of about 0.5 Torr to about 100 Torr. The dielectric constant and the flowability of the flowable oxide layer may be adjusted by changing the deposition conditions.

In some embodiments, the flowable oxide layer includes a Si—O—H bonding and/or a Si—N—H bonding. The flowable oxide layer may exhibit flowability and/or a capillary phenomenon due to the above bonding. Due to the flowability and the capillary phenomenon of the flowable oxide layer, the flowable oxide layer may fill gaps of narrow width, however, when the width of the gap increases, the height of the flowable oxide layer filling the gap may be decreased.

That is, the gaps between the cell gate lines 110A may be completely filled with an insulating layer 122a of the insulating layer 122, however, the outer portion of the selection gate line 110B may not be completely filled with the insulating layer 122. Instead, an insulating layer 122b may be formed thin on the side of the selection gate line 110B and a top surface of the semiconductor substrate 100, because the insulating layer 122 cannot fill the wide space by using the capillary phenomenon.

In some embodiments, the height of the insulating layer 122a between the cell gate lines 110A and the height of the insulating layer 122b on the outer portion of the selection gate line 110B may be adjusted by controlling the deposition conditions. For example, the insulating layer 122a between the cell gate lines 110A may be higher than the bottom surface of the polysilicon layer 114 for a control gate and the height of the insulating layer 122b from the bottom may be lower than one third of the height of the upper surface of the floating gate 112. Some embodiments provide that after depositing the insulating layer 122, an annealing process of the resultant may be performed.

Since the insulating layer 122 is the flowable oxide layer that is formed from the bottom up, gaps between the cell gate lines 110A may be filled with the insulating layer 122 without void or seam, and the gap filling may not be affected by the profile of the gate lines. In addition, since the insulating layer 122 may have low dielectric constant, cell-to-cell interference may be reduced.

In some embodiments, in order to enhance the capillary effect between the cell gate lines 110A for forming the insulating layer 122, surfaces of the gaps between the cell gate lines 110A may be pre-processed by using a wet cleaning process and/or using plasma, before forming the insulating layer 122. The wet cleaning process may be performed by using a solution including, for example, hydrofluoric acid, and the plasma treatment may be performed by using ozone and/or ammonia gas, among others. The above described pre-process may be performed after forming the diffusion barrier.

Figure 2C:
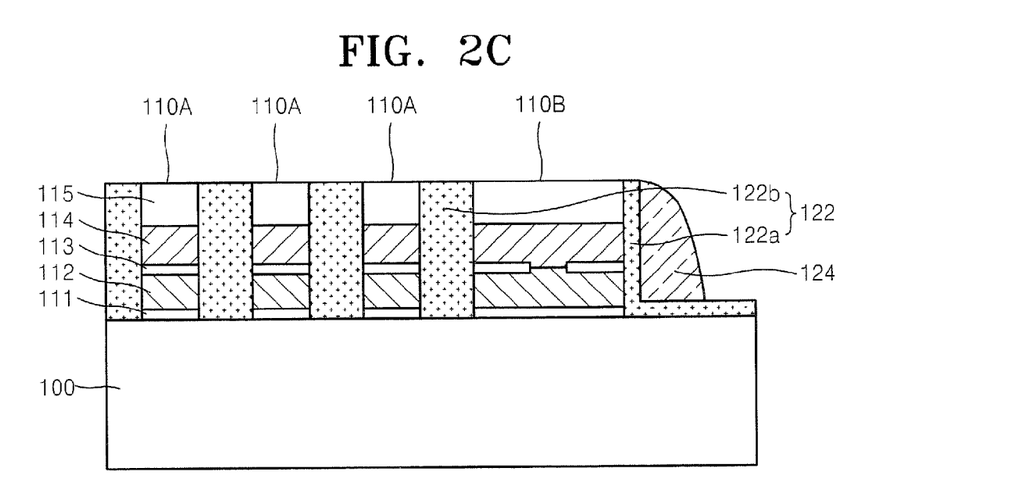

Referring to FIG. 2C, an insulating layer for a spacer may be formed on the semiconductor substrate 100 on which the insulating layer 122 is formed. The insulating layer for the spacer may be etched-back until top surfaces of the cell and selection gate lines 110A and 110B are exposed to form a spacer 124 on the side 110Bb of the selection gate line 110B. In some embodiments, the insulating layer for a spacer may be formed of a moderate temperature oxide (MTO) silicon oxide layer and/or a tetraethyl orthosilicate (TEOS) silicon oxide layer, among others. Some embodiments provide that the insulating layer for a spacer may be formed of a silicon nitride layer. After forming the spacer 124, an ion implantation process for forming an impurity region on a portion where a contact hole will be formed may be performed.

Figure 2D:
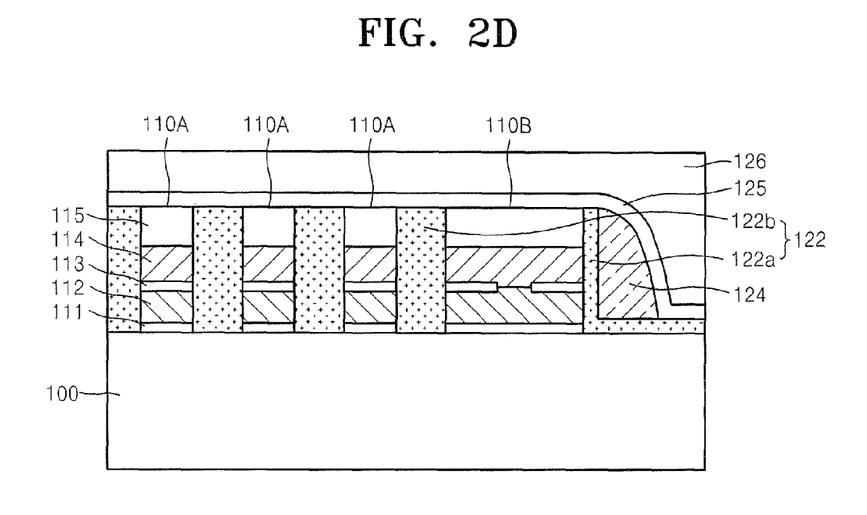

Referring to FIG. 2D, an etch stop layer 125 may be formed on the semiconductor substrate 100 on which the spacer 124 is formed. A second insulating layer 126 may formed so as to completely bury the region where the spacer 124 is formed.

Some embodiments provide that the etch stop layer 125 may be formed of a silicon nitride layer, and the second insulating layer 126 may be formed of a high-density plasma (HDP) oxide layer.

Figure 2E:
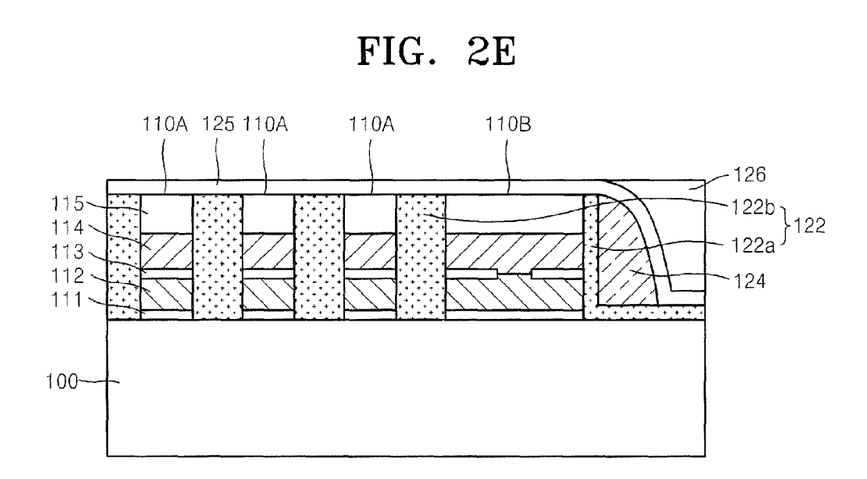

Referring to FIG. 2E, the second insulating layer 126 may be etched-back by using the etch stop layer 125 as the stop layer or polished by a chemical mechanical polish (CMP) method so that the second insulating layer 126, on the region where the spacer 124 is formed, remains, that is, the outer portion of the gate line 110B.

Figure 2F:
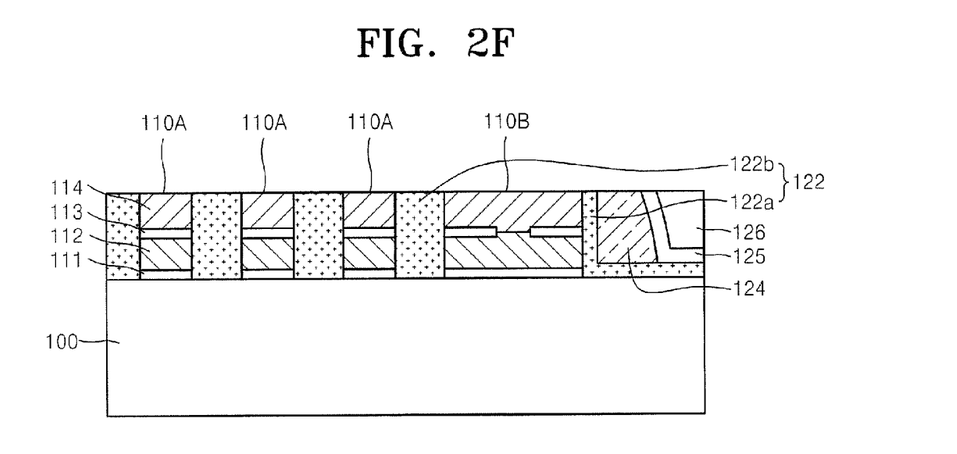

Referring to FIG. 2F, the etch stop layer 125 and the hard mask layer 115 may be removed so as to expose the upper surface of the polysilicon layer 114 for a control gate.

In some embodiments, the second insulating layer 126 may be etched-back or polished by using a CMP method to remove the etch stop layer 125 and the hard mask layer 115 until the upper surface of the polysilicon layer 114 for a control gate is exposed.

Figure 2G:
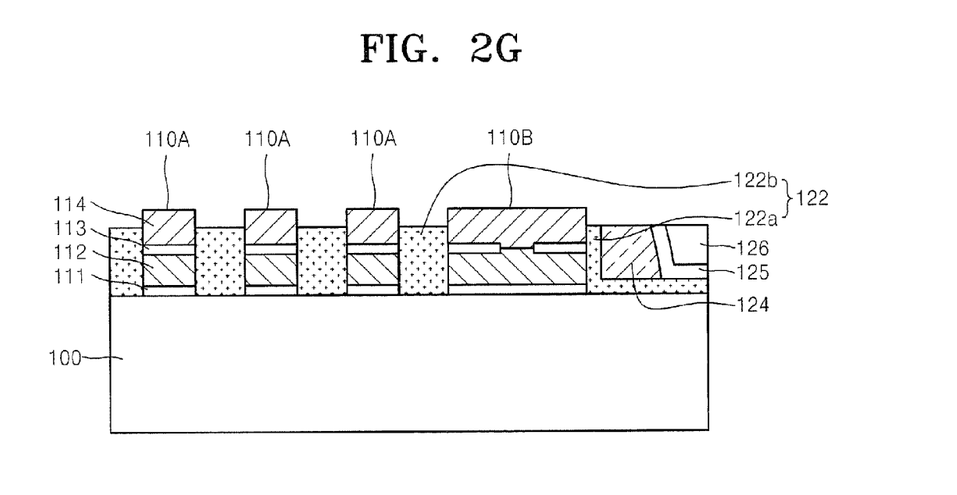

Referring to FIG. 2G, some parts of the insulating layer 122, the spacer 124, the remaining etch stop layer 125, and the second insulating layer 126 may be removed so that a part or an entire portion of side surfaces of the polysilicon layer 114 between the cell and selection gate lines 110A and 110B is exposed. The above operation may be performed with the operations for removing the etch stop layer 125 and the hard mask layer 115, as illustrated in FIG. 2F. Otherwise, the above operation may not be performed. When the above operation is not performed, metal silicide may only be formed from the upper surface of the polysilicon layer 114 when a metal silicide layer for the control gate is performed later.

Figure 2H:
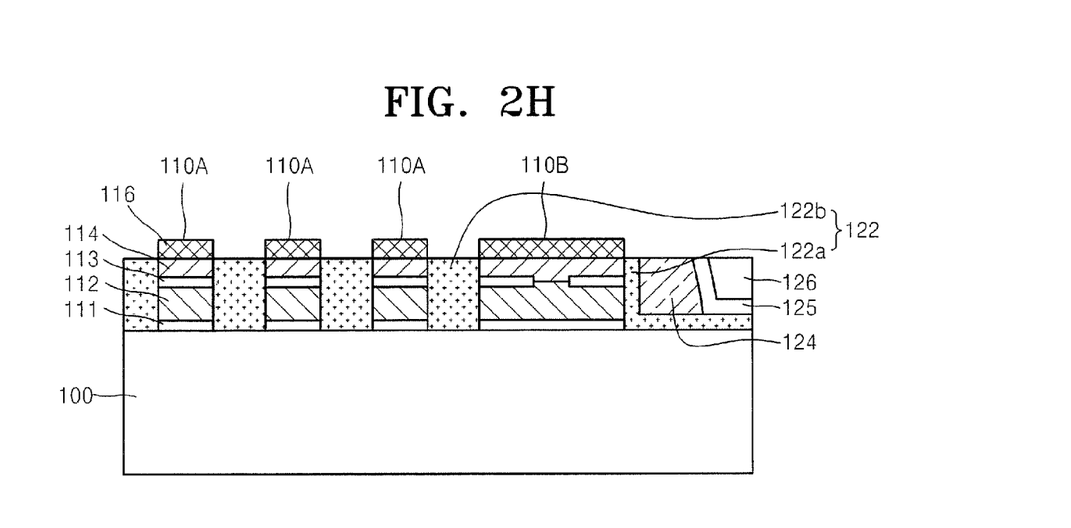

Referring to FIG. 2H, a metal layer may be formed on an entire surface of the semiconductor substrate 100 on which a part or an entire portion of the side surfaces of the polysilicon layer 114 is exposed. The metal layer may be formed of Co, Ni, Ti, Hf, NiTa, NiPt, and/or mixtures thereof. The metal layer may be formed by a physical vapor deposition (PVD) method, a CVD method, and/or an ALD method, among others. In addition, the semiconductor substrate 100 on which the metal layer is formed may be thermally treated to cause a silicidation reaction. Portions of the metal layer on which the silicidation reaction does not occur may be removed to form a metal silicide layer 116 on the polysilicon layer 114. The metal silicide layer 116 can be formed on the polysilicon layer 114 due to the silicidation reaction, or the entire portion of the polysilicon layer 114 can be changed into the metal silicide layer 116.

Figure 2I:
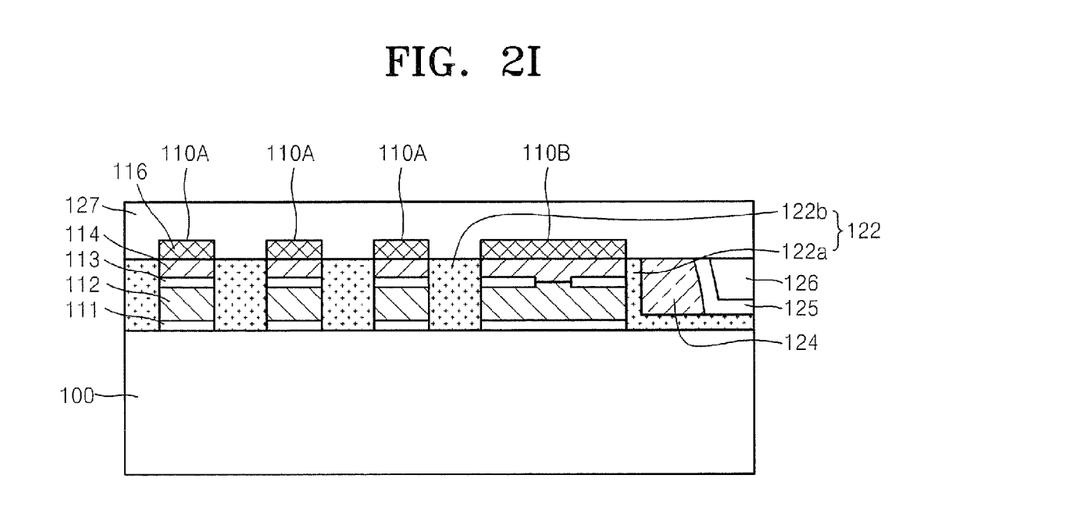

Referring to FIG. 2I, a third insulating layer 127 may be formed on the semiconductor substrate 100 on which the metal silicide layer 116 is formed. In some embodiments, the third insulating layer 127 may be formed of an MTO silicon oxide layer.

Although it is not shown in the drawings, operations for forming the contact holes and bit lines may be performed.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A method of fabricating a flash memory device, the method comprising:
   forming gate lines comprising a plurality of cell gate lines and a selection gate line, each comprising a stacked structure of a tunnel insulating layer, a floating gate, a gate insulating layer, and a polysilicon layer operable to be a control gate, formed on a semiconductor substrate;
   forming a first insulating layer that selectively fills gaps between ones of the plurality of cell gate lines from the bottom up and gaps between a first side of the selection gate line and an adjacent one of the plurality of cell gate lines, and does not fill a space on a second side of the selection gate line that is opposite the first side of the selection gate line;
   forming a spacer on the second side of the selection gate line after forming the first insulating layer; and
   forming a second insulating layer adjacent the spacer on the second side of the selection gate line,
   removing some parts of the first insulating layer, the second insulating layer, and the spacer so that at least a part of upper and side surfaces of the polysilicon layer is exposed; and
   forming a metal silicide on the exposed portion of the polysilicon layer.

2. The method of claim 1, wherein the first insulating layer is formed in a chemical vapor deposition (CVD) method using octamethylcyclotetrasiloxane (OMCTS) or tetramethylorthosilicate (TMOS) as a source material.

3. The method of claim 2, wherein forming the first insulating layer is performed at a deposition temperature of about 0° C. to 100° C. and a deposition pressure of about 0.5 Torr to 100 Torr.

4. The method of claim 1, wherein the first insulating layer includes a Si—O—H flowable oxide layer or a Si—N—H flowable oxide layer.

5. The method of claim 4, wherein the first insulating layer has a dielectric constant of about 1 to 3.5.

6. The method of claim 1, wherein the spacer is formed of a moderate temperature oxide (MTO) silicon oxide layer and/or a tetraethyl orthosilicate (TEOS) silicon oxide layer.

7. The method of claim 1, further comprising forming an etch stop layer, after forming the spacer and before forming the second insulating layer.

8. A method of fabricating a flash memory device, the method comprising:
   forming gate lines comprising a plurality of cell gate lines and a selection gate line, each comprising a stacked structure of a tunnel insulating layer, a floating gate, a gate insulating layer, and a polysilicon layer operable to be a control gate, formed on a semiconductor substrate;
   forming a first insulating layer that selectively fills gaps between the plurality of cell gate lines from the bottom up and between adjacent ones of the plurality of cell gate lines and the selection gate line, and does not fill a space located on an outer side of the selection gate line that is opposite the plurality of cell gate lines;
   forming a spacer on the outer side of the selection gate line that is opposite to the plurality of cell gate lines, after forming the first insulating layer;
   forming a second insulating layer adjacent the spacer on the outer side of the selection gate line,
   removing a hard mask of the gate lines;
   removing some parts of the first insulating layer, the second insulating layer, and the spacer so that at least a part of upper and side surfaces of the polysilicon layer operative to be the control gate in the gate lines is exposed;
   forming a metal silicide on the exposed portion of the polysilicon layer operative to be the control gate; and
   forming a third insulating layer on the semiconductor substrate on which the metal silicide is formed.

9. The method of claim 8, wherein the first insulating layer is formed in a chemical vapor deposition (CVD) method using octamethylcyclotetrasiloxane (OMCTS) or tetramethylorthosilicate (TMOS) as a source material.

10. The method of claim 8, wherein forming the first insulating layer is performed at a deposition temperature of about 0° C. to 100° C. and a deposition pressure of about 0.5 Torr to 100 Torr.

11. The method of claim 8, wherein the first insulating layer includes a Si—O—H flowable oxide layer or a Si—N—H flowable oxide layer.

12. The method of claim 8, wherein the first insulating layer has a dielectric constant of about 1 to 3.5.

13. The method of claim 8, wherein the spacer is formed of a moderate temperature oxide (MTO) silicon oxide layer and/or a tetraethyl orthosilicate (TEOS) silicon oxide layer.

14. The method of claim 8, further comprising forming an etch stop layer, after forming the spacer and before forming the second insulating layer.

15. The method of claim 8, wherein the second insulating layer includes a high-density plasma (HDP) oxide layer.

* * * * *